United States Patent
Lin et al.

(10) Patent No.: US 12,039,232 B2
(45) Date of Patent: Jul. 16, 2024

(54) PULSE-WIDTH MODULATION SIGNAL OBSERVATION CIRCUIT AND HARDWARE-IN-THE-LOOP SIMULATION DEVICE HAVING THE SAME

(71) Applicant: Industrial Technology Research Institute, Hsin-Chu (TW)

(72) Inventors: Chun-An Lin, Taoyuan (TW); Wen-Che Shen, New Taipei (TW); Chih-Wei Yeh, Taipei (TW); Po-Huan Chou, Hsinchu County (TW); Chun-Chieh Chang, Taipei (TW); Yu-Hsun Wu, Taipei (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 847 days.

(21) Appl. No.: 17/134,030

(22) Filed: Dec. 24, 2020

(65) Prior Publication Data

US 2022/0114303 A1    Apr. 14, 2022

(30) Foreign Application Priority Data

Oct. 12, 2020  (TW) .................. 109135161

(51) Int. Cl.
*H03M 3/00* (2006.01)
*G01R 19/00* (2006.01)
(Continued)

(52) U.S. Cl.
CPC ......... *G06F 30/20* (2020.01); *G01R 19/0084* (2013.01); *G01R 29/023* (2013.01); *G06F 30/30* (2020.01); *H03M 1/66* (2013.01)

(58) Field of Classification Search
CPC ...... H03M 1/66; H03M 3/502; H03M 7/3028; H03M 7/3042; H02M 3/156; H02M 3/158;
(Continued)

(56) References Cited

U.S. PATENT DOCUMENTS 6,275,018 B1 * 8/2001 Telefus .................. H02M 3/156
363/16
6,377,032 B1 * 4/2002 Andruzzi ............. H02M 3/1588
323/224
(Continued)

FOREIGN PATENT DOCUMENTS

CN        106814638 A     6/2017
CN        108448960 A     8/2018
(Continued)

OTHER PUBLICATIONS

Weltin-Wu et al. "A 3.5 GHz Digital Fractional-PLL Frequency Synthesizer Based on Ring Oscillator Frequency-to-Digital Conversion", Oct. 30, 2015, IEEE Journal of Solid-State Circuits, IEEE.
(Continued)

*Primary Examiner* — Linh V Nguyen
(74) *Attorney, Agent, or Firm* — WPAT, P.C

(57) ABSTRACT

A hardware-in-the-loop (HIL) simulation device is provided, which includes a processing circuit and a pulse-width modulation (PWM) signal observation circuit. The PWM signal observation circuit includes an energy storage unit and the energy storage unit is coupled to the processing circuit. A signal source transmits a PWM signal to the processing circuit and the PWM signal observation circuit, and the energy storage unit is charged when the PWM signal is at high level. The processing circuit detects the voltage of the
(Continued)

energy storage unit when detecting the falling edge of the PWM signal so as to calculate the duty cycle of the PWM signal.

20 Claims, 7 Drawing Sheets

(51) Int. Cl.
    *G01R 29/02*     (2006.01)
    *G06F 30/20*     (2020.01)
    *G06F 30/30*     (2020.01)
    *H03M 1/66*     (2006.01)

(58) Field of Classification Search
    CPC ............ H02M 3/1584; H02M 1/0009; H02M 1/0022; H02M 3/157; H02M 3/1588; H02M 1/0025; H02M 1/0032; H02M 1/088; H02M 3/33507; H02M 1/0019; H02M 1/0035; H02M 1/0058; H02M 1/0095; H02M 1/14; H02M 1/15; H02M 1/32; H02M 1/36; H02M 3/003; H02M 3/01; H02M 3/07; H02M 3/1566; H02M 3/1582; H02M 3/33515; H02M 3/33523; H02M 3/33561; H02M 3/33571; H02M 7/003
    USPC .................................................. 341/143, 144
    See application file for complete search history.

(56) References Cited

U.S. PATENT DOCUMENTS

| | | | | |
|---|---|---|---|---|
| 6,396,252 B1 * | 5/2002 | Culpepper | ............ | H02M 3/156 323/284 |
| 6,424,207 B1 * | 7/2002 | Johnson | .................. | H02M 1/15 327/552 |
| RE38,487 E * | 4/2004 | Isham | ................. | H02M 3/1588 323/283 |
| 7,677,114 B2 | 3/2010 | Deshmukh et al. | | |
| 7,764,054 B1 * | 7/2010 | Guo | ...................... | H02M 3/156 323/283 |
| 7,863,875 B1 * | 1/2011 | Guo | ................... | H02M 3/1584 323/275 |
| 7,936,160 B1 * | 5/2011 | Sheehan | ............... | H02M 3/156 323/288 |
| 8,154,264 B2 * | 4/2012 | Kenly | ................... | H02M 3/156 323/285 |
| 9,417,642 B2 * | 8/2016 | Chiu | ....................... | G05F 1/468 |
| 9,899,913 B2 * | 2/2018 | Chang | .................. | H02M 3/156 |
| 10,622,932 B2 | 4/2020 | Holthaus | | |
| 2008/0218133 A1 * | 9/2008 | Kuan | ..................... | H02M 3/156 323/234 |
| 2008/0312855 A1 | 12/2008 | Monti et al. | | |
| 2018/0278147 A1 * | 9/2018 | Regvar | ................... | H02M 1/08 |
| 2019/0123725 A1 | 4/2019 | Vulpoiu et al. | | |
| 2020/0083794 A1 * | 3/2020 | Bhandarkar | .......... | H02M 3/157 |

FOREIGN PATENT DOCUMENTS

| | | |
|---|---|---|
| CN | 108469778 A | 8/2018 |
| TW | 201208259 A | 2/2012 |
| TW | 201220934 A | 5/2012 |
| TW | I514100 | 12/2015 |
| TW | I530078 | 4/2016 |
| TW | 201935029 A | 9/2019 |
| WO | WO2016171799 A1 | 10/2016 |
| WO | WO2019/140800 A1 | 7/2019 |

OTHER PUBLICATIONS

Deepa et al. "A Study of Comparative Analysis of Different PWM Techniques", Aug. 17, 2017, 2017 International Conference on Smart Technologies for Smart Nation (SmartTechCon), IEEE.

Liu et al. "A Simultaneous Analog-Digital Signal Transmission System Based on PFM and PWM", Jul. 8, 2016, 2016 3rd International Conference on Information Science and Control Engineering (ICISCE), IEEE.

Guo et al. "Analysis and Design of PWM-in-PWM-out Class D Amplifiers", Aug. 3, 2014, 2014 IEEE 57th International Midwest Symposium on Circuits and Systems (MWSCAS), IEEE.

Wang et al. "Analysis of Double-T Filter Used for PWM Circuit to D/A Converter", May 23, 2012, 2012 24th Chinese Control and Decision Conference (CCDC), IEEE.

Yelkenci et a. "CMOS Optical Receiver for Low Power Biomedical Microsystems", May 15, 2017, 2017 25th Signal Processing and Communications Applications Conference (SIU), IEEE.

TW OA issued on Mar. 31, 2021.

\* cited by examiner

PULSE-WIDTH MODULATION SIGNAL OBSERVATION CIRCUIT AND HARDWARE-IN-THE-LOOP SIMULATION DEVICE HAVING THE SAME

CROSS REFERENCE TO RELATED APPLICATION

All related applications are incorporated by reference. The present application is based on, and claims priority from, Taiwan Application Serial Number 109135161, filed on Oct. 12, 2020, the disclosure of which is hereby incorporated by reference herein in its entirety.

TECHNICAL FIELD

The technical field relates to a pulse-width modulation signal observation circuit and a hardware-in-the-loop simulation device including the pulse-width modulation signal observation circuit.

BACKGROUND

Pulse-width modulation (PWM) is a digital-to-analog conversion technology, which is frequently applied to motor control systems, switching power systems or other systems. In general, a driver can generate a PWM signal and transmits the PWM signal to a power device (e.g. MOSFET, IGBT, etc.), such that the driver can control a controlled device (e.g. inductor, motor, etc.) via the power device. However, if a tester would like to test the driver by the above systems, the power device may be damaged or the systems may be damaged because the algorithms used are defective.

Accordingly, hardware-in-the-loop (HIL) simulation devices are developed in order to solve the above problem. HIL simulation devices can simulate power devices and various controlled devices, so testers can test drivers via HIL simulation devices. However, a currently HIL simulation device needs to be installed with a high-frequency field programmable gate array (FPGA) chip to detect the PWM signal and the sampling rate of the chip should be several hundred times greater than the frequency of the PWM signal so as to achieve sufficient resolution.

SUMMARY

An embodiment of the disclosure relates to a pulse-width modulation (PWM) signal observation circuit, which includes a power source unit, an energy storage unit and a switch unit. The energy storage unit is coupled to the processing circuit. The switch unit is coupled to the energy storage unit and the power source unit in order to control the power source unit to charge the energy storage unit. A signal source transmits a PWM signal to the switch unit and the processing circuit. The switch unit is in a first status when the PWM signal is at high level, such that the power source unit charges the energy storage unit. The processing circuit detects the voltage of the energy storage unit in order to calculate the duty cycle of the PWM signal when the processing circuit detects the falling edge of the PWM signal.

Another embodiment of the disclosure relates to a hardware-in-the-loop (HIL) simulation device, which includes a processing circuit and a PWM signal observation circuit. The PWM signal observation circuit includes an energy storage unit and the energy storage unit is coupled to the processing circuit. A signal source transmits a PWM signal to the switch unit and the processing circuit. The energy storage unit is charged when the PWM signal is at high level. The processing circuit detects the voltage of the energy storage unit in order to calculate the duty cycle of the PWM signal when the processing circuit detects the falling edge of the PWM signal.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The disclosure will become more fully understood from the detailed description given herein below and the accompanying drawings which are given by way of illustration only, and thus are not limitative of the disclosure and wherein.

DETAILED DESCRIPTION

Figure 1:
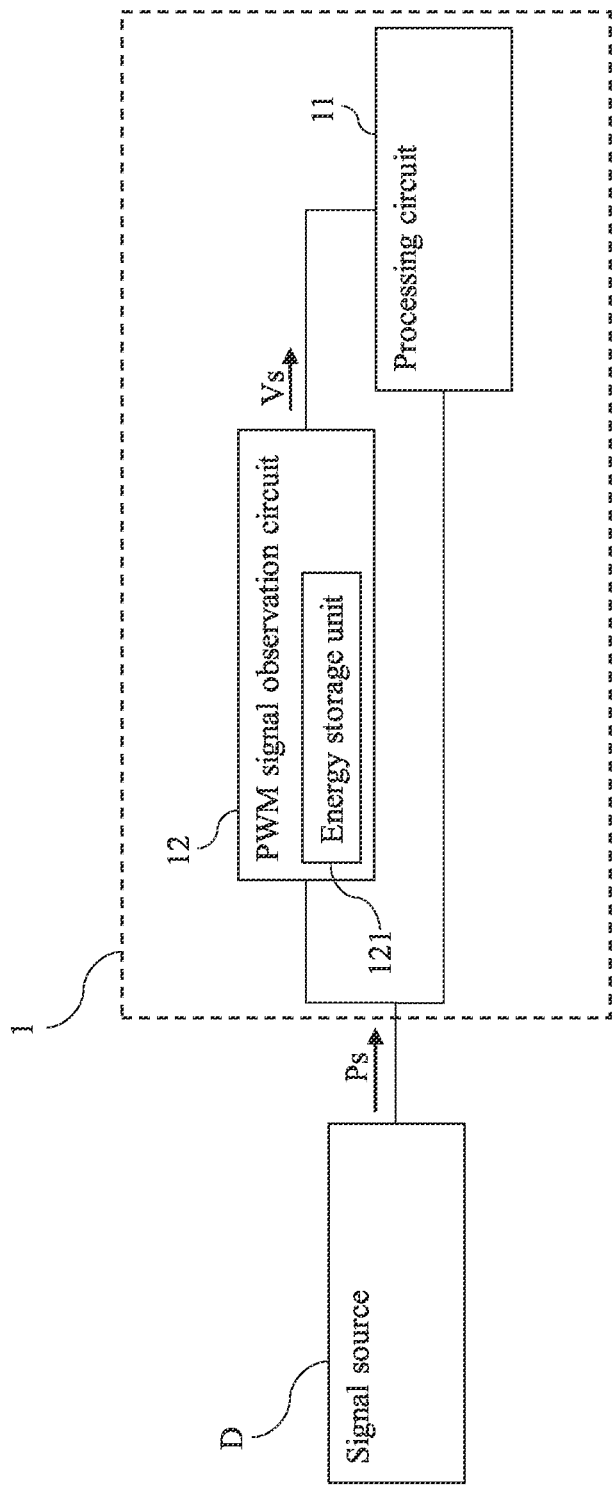
FIG. 1 is a circuit block diagram of a hardware-in-the-loop simulation device in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Please refer to FIG. 1, which is a circuit block diagram of a hardware-in-the-loop simulation device in accordance with a first embodiment of the disclosure. As shown in FIG. 1, the hardware-in-the-loop (HIL) simulation device 1 includes a processing circuit 11 and a pulse-width modulation (PWM) signal observation circuit 12, and the HIL simulation device 1 is coupled to an external signal source D. The signal source D generates a PWM signal Ps and transmits the PWM signal Ps to the processing circuit 11 and the PWM signal observation circuit 12. In one embodiment, the signal source D may be a controller, a driver or other similar elements.

The processing circuit 11 is coupled to the PWM signal observation circuit 12 and receives the PWM signal Ps from the signal source D. In one embodiment, the processing circuit 11 may be a micro processing unit (MCU), a central processing unit (CPU) or other similar elements.

The PWM signal observation circuit 12 includes an energy storage unit 121 and the energy storage unit 121 also receives the PWM signal Ps from the signal source D. The energy storage unit 121 is coupled to the processing circuit 11. In one embodiment, the energy storage unit 121 may be a capacitor or other similar elements.

When the PWM signal Ps is at high level, the energy storage unit 121 is charged. When the processing circuit 11 detects the falling edge of the PWM signal Ps, the processing circuit 11 detects the voltage Vs of the energy storage unit 121 and then calculates the duty cycle of the PWM signal Ps according to the voltage Vs. Afterward, the energy storage unit 121 is discharged when the PWM signal Ps is at low level.

The processing circuit 11 can calculate the duty cycle of the PWM signal Ps according to the charge-discharge model of the energy storage unit 121. The charge-discharge model provides the relative relation of the voltage Vs of the energy storage unit 121 and the duty cycle of the PWM signal Ps. Accordingly, the processing circuit 11 can calculate the duty cycle of the PWM signal Ps according to the voltage Vs detected and the charge-discharge model of the energy storage unit 121.

As described above, the HIL simulation device 1 can observe the duty cycle via the PWM signal observation circuit 12, so the HIL simulation device 1 can obtain the PWM signal Ps with high resolution without using field programmable gate array (FPGA) chip so as to test the signal source D. Therefore, the cost of the HIL simulation device 1 can be effectively reduced, which can satisfy the requirements of more applications.

The embodiment just exemplifies the disclosure and is not intended to limit the scope of the disclosure. Any equivalent modification and variation according to the spirit of the disclosure is to be also included within the scope of the following claims and their equivalents.

Figure 2A:
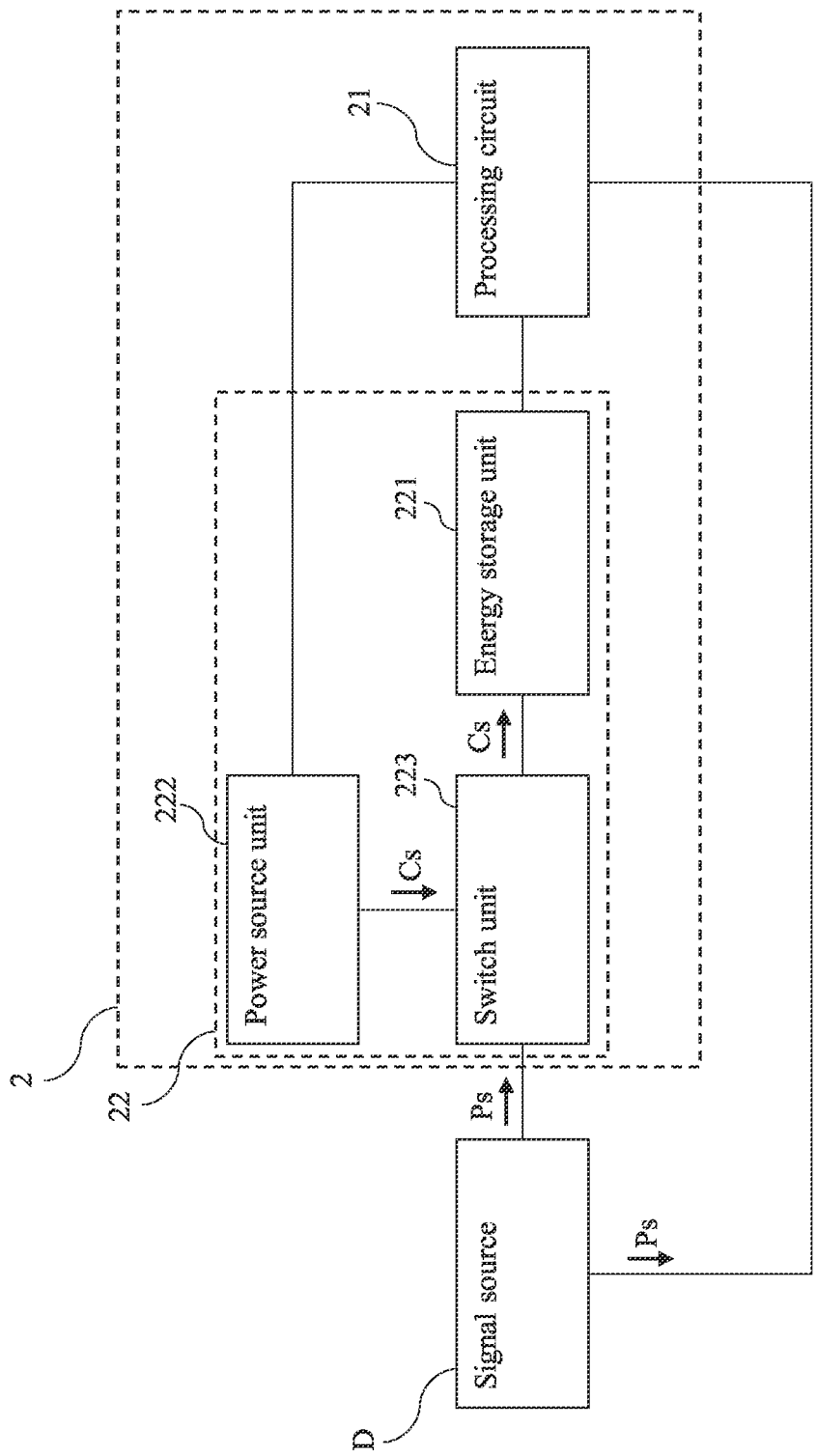
FIG. 2A~FIG. 2B are circuit block diagrams of a HIL simulation device in accordance with a second embodiment of the disclosure.
Figure 2B:
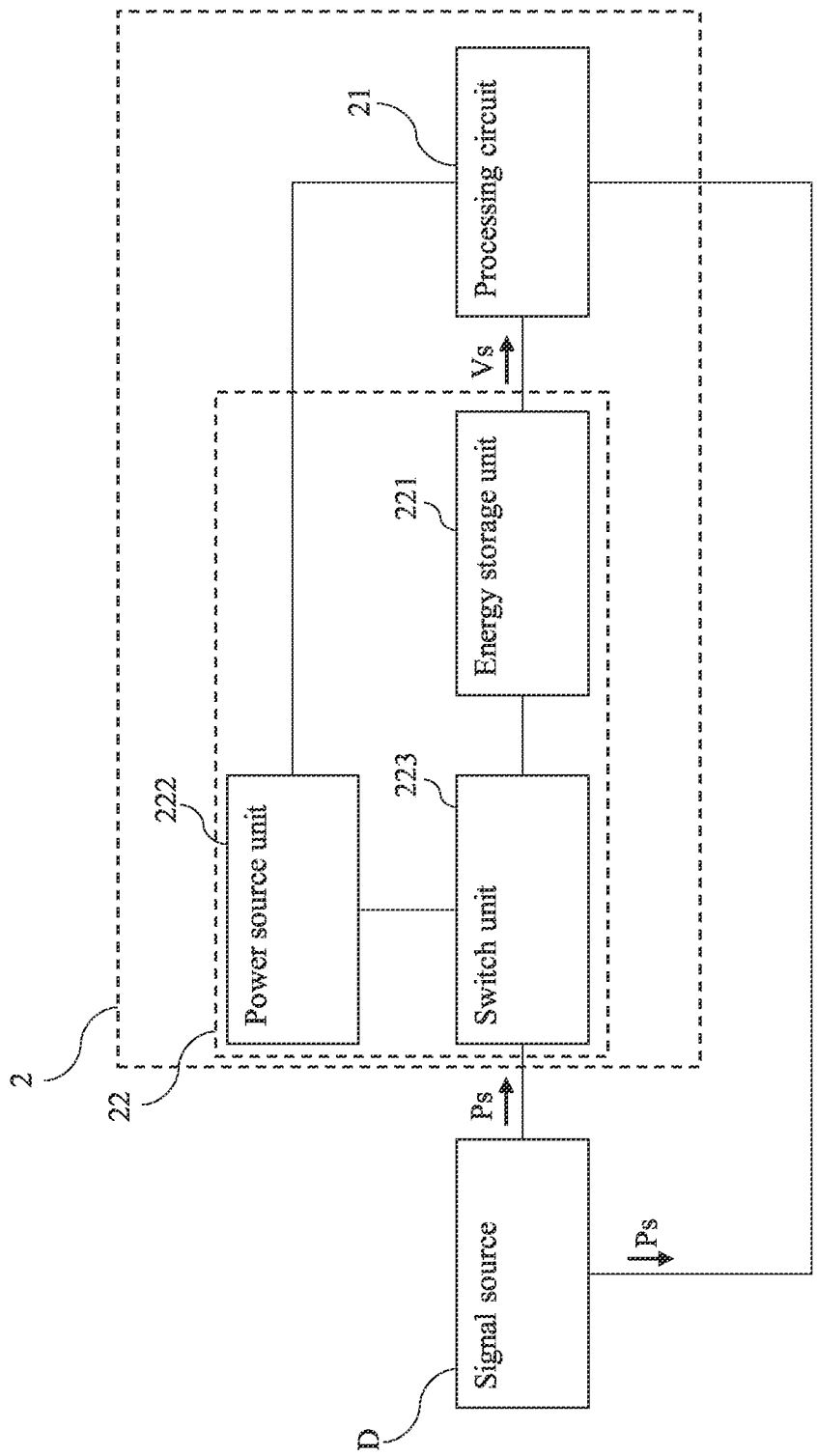

Please refer to FIG. 2A~FIG. 2B, which are circuit block diagrams of a HIL simulation device in accordance with a second embodiment of the disclosure. As shown in FIG. 2A, the HIL simulation device 2 includes a processing circuit 21 and a PWM signal observation circuit 22, and the HIL simulation device 2 is coupled to an external signal source D. The signal source D generates a PWM signal Ps and transmits the PWM signal Ps to the processing circuit 21 and the PWM signal observation circuit 22.

The processing circuit 21 is coupled to the PWM signal observation circuit 22 and receives the PWM signal Ps from the signal source D.

The PWM signal observation circuit 22 includes a power source unit 222, an energy storage unit 221 and a switch unit 223, and the energy storage unit 221 also receives the PWM signal Ps from the signal source D. The energy storage unit 221 is coupled to the processing circuit 21 and the switch unit 223. In one embodiment, the energy storage unit 221 may be a capacitor or other similar elements.

The switch unit 223 is coupled to the power source unit 222 and controls the power source unit 222 to charge the energy storage unit 221. In one embodiment, the switch unit 223 may be a metal-oxide-semiconductor field-effect transistor (MOSFET), an insulated gate bipolar transistor (IGBT) or other similar elements.

The power source unit 222 is coupled to the processing circuit 21. In one embodiment, the power source unit 222 may be a current source, a voltage source or other similar elements.

As set forth above, the signal source D transmits the PWM signal Ps to the switch unit 223 and the processing circuit 21. More specifically, the switch unit 223 of the PWM signal observation circuit 22 receives the PWM signal Ps; when the PWM signal Ps is at high level, the switch unit 223 is switched to a first status and then the power source unit 222 outputs the charging current Cs to charge the energy storage unit 221.

Afterward, as shown in FIG. 2B, when the processing circuit 21 detects the falling edge of the PWM signal Ps, the processing circuit 21 detects the voltage Vs of the energy storage unit 221, and calculates the duty cycle of the PWM signal Ps according to the voltage Vs and the charge-discharge model of the energy storage unit 221. Then, the switch unit 223 is switched to a second status when the PWM signal Ps is at low level so as to discharge the switch unit 221. In this embodiment, the first status is OFF status and the second status is ON status. In other words, the switch unit 223 is in OFF status when the PWM signal Ps is at high level so as to make the power source unit 222 output the charging current Cs to charge the energy storage unit 221. On the contrary, the switch unit 223 is switched to ON status when the PWM signal Ps is at low level so as to make the energy storage unit 221 be discharged. Moreover, the processing circuit 21 may include a digital-to-analog converter (not shown in the drawings) and the processing circuit 21 can receive the voltage Vs of the energy storage unit 221 via the digital-to-analog converter.

In another embodiment, the first status may be ON status and the second status may be OFF status. That is to say, the switch unit 223 is in ON status when the PWM signal Ps is at high level so as to make the power source unit 222 output the charging current Cs to charge the energy storage unit 221. On the contrary, the switch unit 223 is switched to OFF status when the PWM signal Ps is at low level so as to make the energy storage unit 221 be discharged. The above mechanisms can be realized by different circuit designs and all of which should be included within the scope of the following claims and their equivalents.

Figure 3:
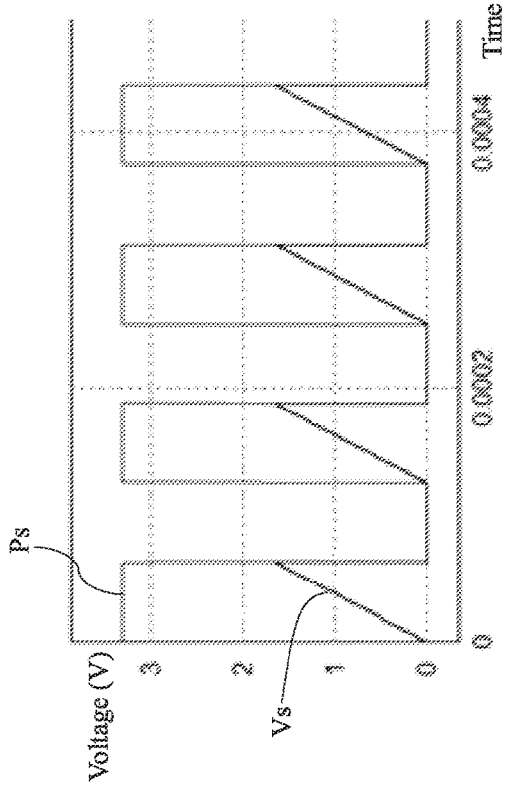
FIG. 3 is a first schematic view of the relative relation of the voltage of the energy storage unit and the duty cycle of the PWM signal in accordance with the second embodiment of the disclosure.
Figure 4:
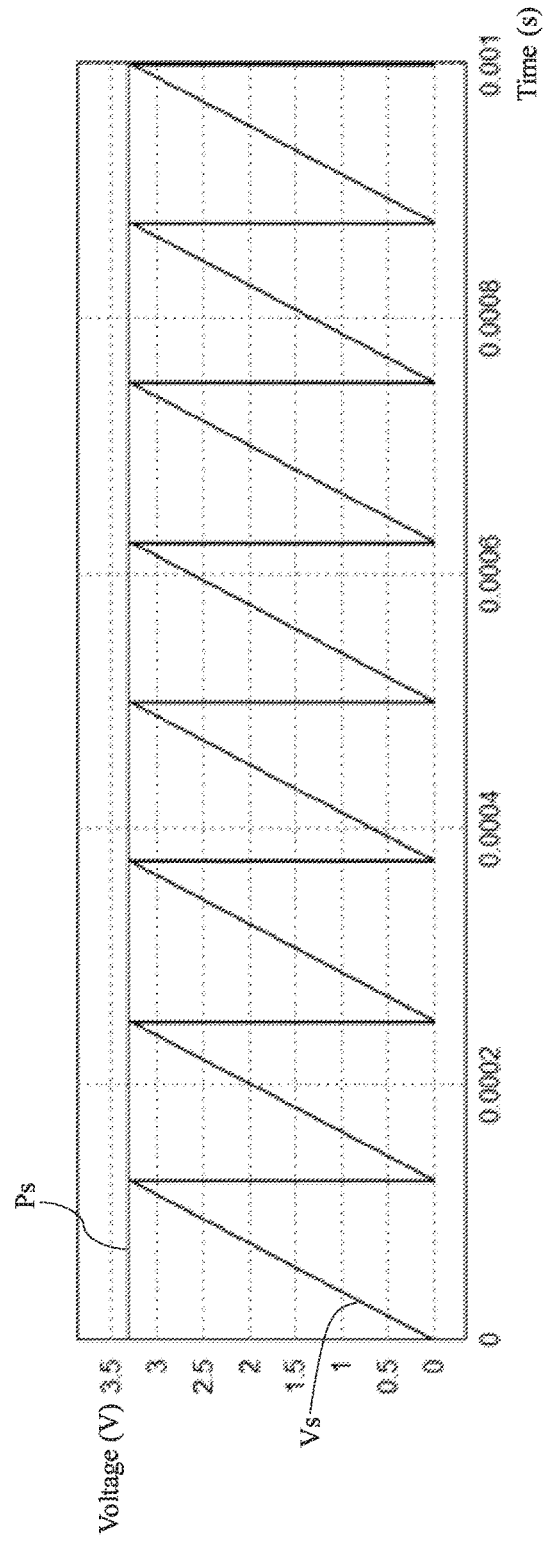
FIG. 4 is a second schematic view of the relative relation of the voltage of the energy storage unit and the duty cycle of the PWM signal in accordance with the second embodiment of the disclosure.

Please refer to FIG. 3 and FIG. 4, which are a first schematic view and a second schematic view of the relative relation of the voltage of the energy storage unit and the duty cycle of the PWM signal in accordance with the second embodiment of the disclosure. As described above, the energy storage unit 221 may be a capacitor, and the charge-discharge model of the energy storage unit 221 provides the relative relation of the voltage Vs of the energy storage unit 221 and the duty cycle of the PWM signal Ps. FIG. 3 shows the relative relation of the voltage Vs of the energy storage unit 221 and the duty cycle of the PWM signal Ps when the duty cycle of the PWM signal Ps is 50%.

FIG. 4 shows the relative relation of the voltage Vs of the energy storage unit 221 and the duty cycle of the PWM signal Ps when the duty cycle of the PWM signal Ps is 99%. Therefore, the charge-discharge model of the energy storage unit 221 can record the voltages Vs, corresponding to different duty cycles of the PWM signal Ps, of the energy storage unit 221. Accordingly, the processing circuit 21 can calculate the duty cycle of the PWM signal Ps according to the voltage Vs detected from the energy storage unit 221 and the charge-discharge model of the energy storage unit 221.

Via the above mechanism, the HIL simulation device 2 can control the power source unit 222 to charge or discharge the energy storage unit 221 by switching the switch unit 223 of the PWM signal observation circuit 22. Further, the HIL simulation device 2 can detect the voltage Vs of the energy storage unit 221 when detecting the falling edge of the PWM signal Ps. Then, the HIL simulation device 2 can calculate the duty cycle of the PWM signal Ps according to the voltage Vs and the charge-discharge model of the energy storage unit 221. In this way, the HIL simulation device 2 can acquire the PWM signal Ps with high resolution without using FPGA chip so as to test the signal source D. Thus, the cost of the HIL simulation device 2 can be further reduced, so can satisfy the requirements of more applications.

Besides, as the processing circuit 21 can receive the voltage Vs of the energy storage unit 221 via the digital-to-analog converter, so the resolution of the HIL simulation device 2 is determined by the digital-to-analog converter. In addition, the input resolution of the PWM signal Ps can be increased. Therefore, the resolution of the HIL simulation device 2 can be increased by replacing the digital-to-analog converter, which is more flexible in use. Moreover, the burden of the processing circuit 21 of the HIL simulation device 2 can be effectively decreased.

The embodiment just exemplifies the disclosure and is not intended to limit the scope of the disclosure. Any equivalent modification and variation according to the spirit of the disclosure is to be also included within the scope of the following claims and their equivalents.

It is worthy to point that a currently HIL simulation device need to detect a PWM signal via a FPAG chip. Thus, the cost of the HIL simulation device would greatly increase because the price of the FPGA chip is high. On the contrary, according to one embodiment of the disclosure, the HIL simulation device can directly calculate the duty cycle of the PWM signal via an energy storage unit without using FPGA chip, so the cost of the HIL simulation device can be significantly reduced.

Besides, the currently HIL simulation device need to detect a PWM signal via the FPAG chip, so the resolution of the HIL simulation device is also limited by the clock of the FPGA chip. On the contrary, according to one embodiment of the disclosure, the resolution of the HIL simulation device is determined by the digital-to-analog converter of the processing circuit of the HIL simulation device. Therefore, the resolution of the HIL simulation device can be increased by replacing the digital-to-analog converter, which is more flexible in use.

Moreover, the operational mechanism of the currently available HIL simulation device would result in great burden to the processing circuit of the HIL simulation device. On the contrary, according to one embodiment of the disclosure, the HIL simulation device can increase the input resolution of the PWM signal, so the HIL simulation device can obtain the PWM signal with high resolution and effectively reduce the burden of the processing circuit of the HIL simulation device.

Figure 5A:
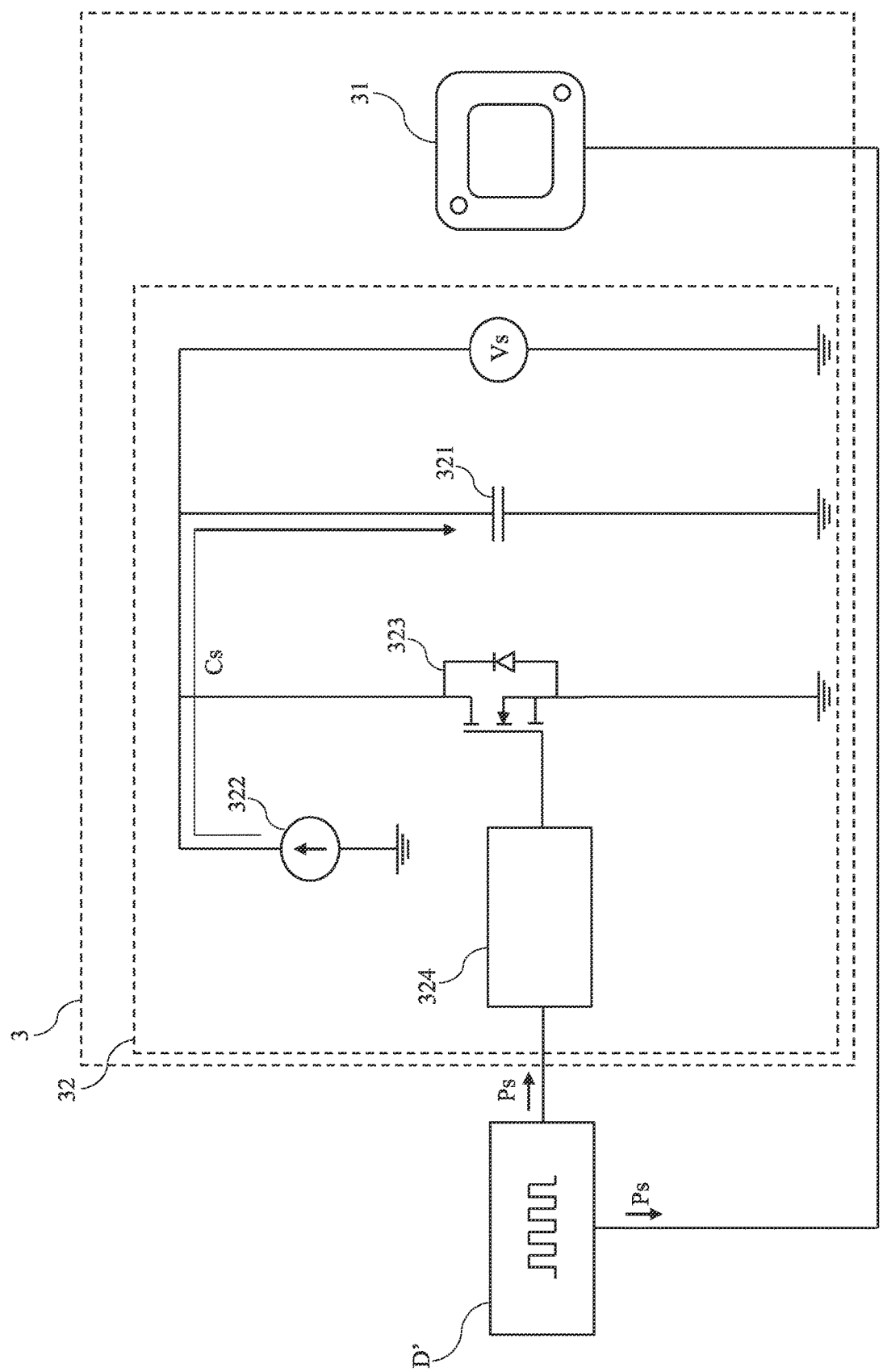
FIG. 5A~FIG. 5B are circuit diagrams of a hardware-in-the-loop simulation device in accordance with a third embodiment of the disclosure.
Figure 5B:
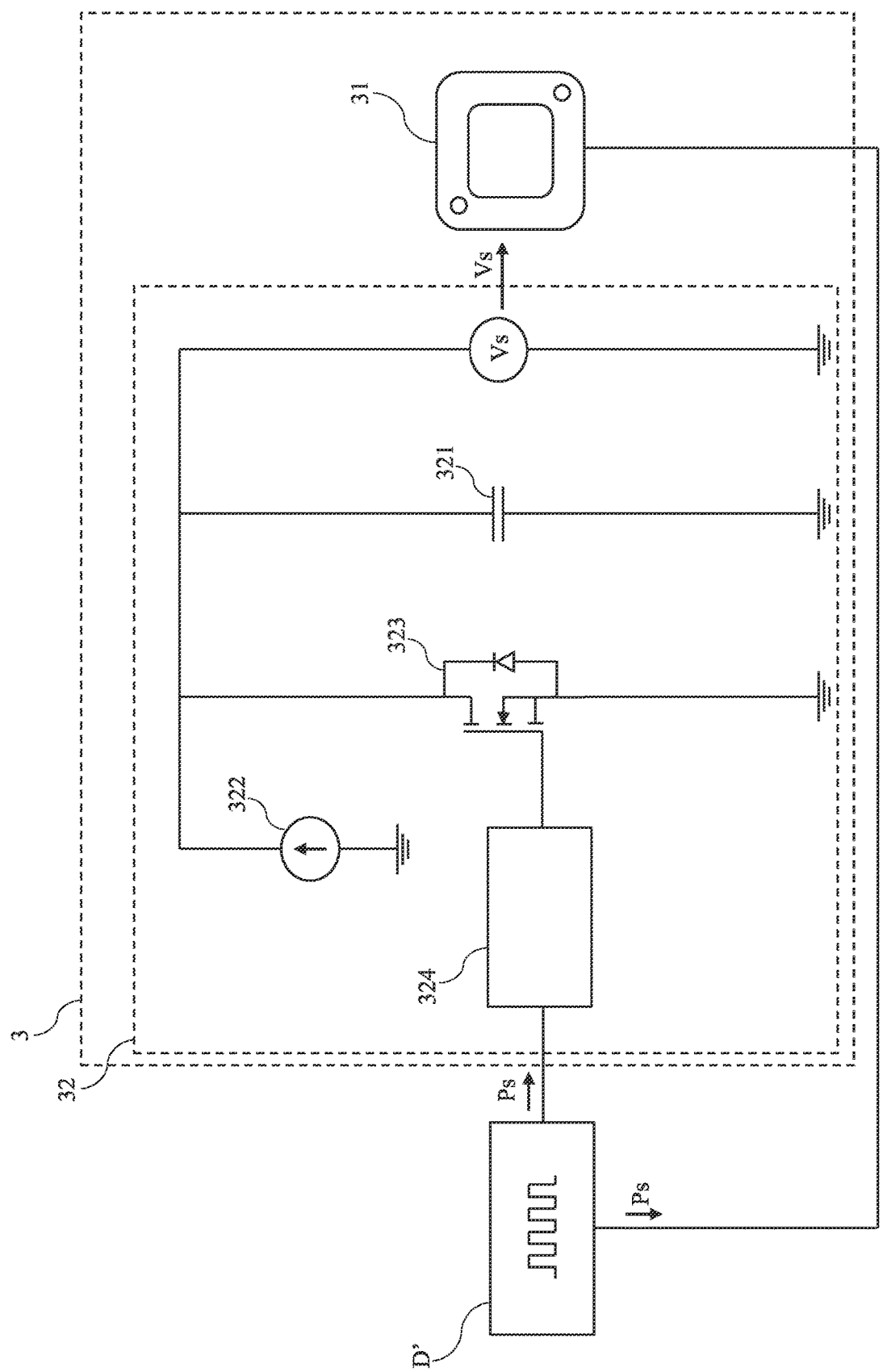

Please refer to FIG. 5A and FIG. 5B, which are circuit diagrams of a hardware-in-the-loop simulation device in accordance with a third embodiment of the disclosure. FIG. 5A and FIG. 5B illustrate one circuit structure of the HIL simulation device. As shown in FIG. 5A, the HIL simulation device 3 includes a MCU 31 and a PWM signal observation circuit 32, and the HIL simulation device 3 is coupled to a driver D'. The driver D' generates a PWM signal Ps and transmits the PWM signal Ps to the MCU 31 and the PWM signal observation circuit 32.

The MCU 31 is coupled to the PWM signal observation circuit 32 and receives the PWM signal Ps from the driver D'.

The PWM signal observation circuit 32 includes a current source 322a, a capacitor 321, a transistor (MOSFET) 322a and a gate driver 324. The gate of the transistor 323 is coupled to the gate driver 324 in order to receive the PWM signal Ps from the driver D' via the gate driver 324. The drain of the transistor 323 is coupled to the current source 322a and one end of the capacitor 321. The source of the transistor 323 and the other end of the capacitor 321 are grounded. The MCU 31 is coupled to the drain of the transistor 323, the current source 322a and one end of the capacitor 321.

The gate driver 324 includes a NOT gate. Thus, when the PWM signal Ps at is at high level, the transistor 323 is in OFF status and the capacitor 321 is charged by the charging current Cs generated by the current source 322a.

As shown in FIG. 5B, when the MCU 31 detects the falling edge of the PWM signal Ps, the MCU 31 detects the voltage Vs of the capacitor 321. Next, the MCU 31 calculates the duty cycle of the PWM signal Ps according to the voltage Vs and the charge-discharge model of the capacitor 321. Afterward, the transistor 323 is switched to ON status when the PWM signal Ps is at low level in order to discharge the capacitor 321.

The embodiment just exemplifies the disclosure and is not intended to limit the scope of the disclosure. Any equivalent modification and variation according to the spirit of the disclosure is to be also included within the scope of the following claims and their equivalents.

Figure 6:
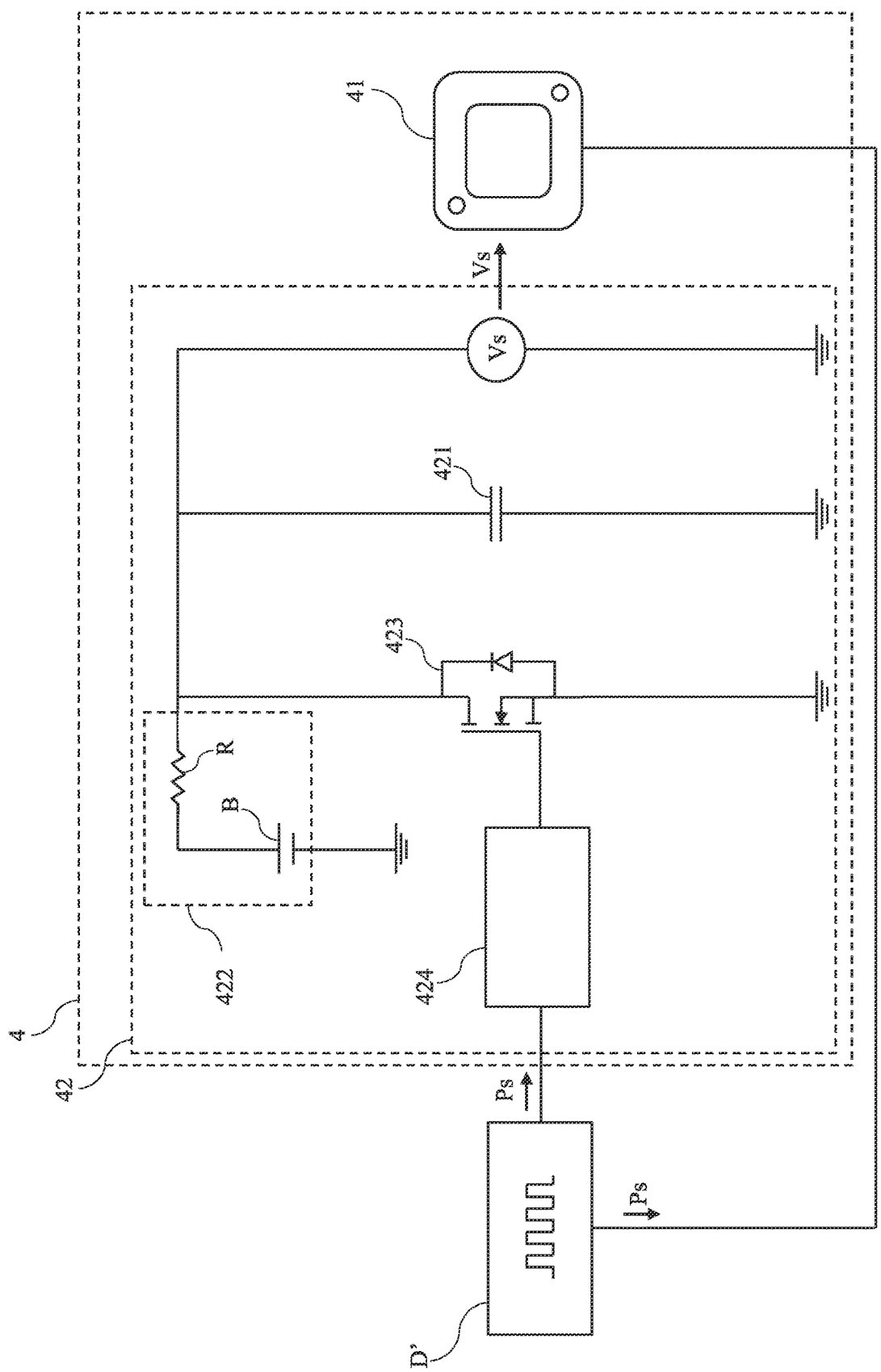
FIG. 6 is a circuit diagram of a hardware-in-the-loop simulation device in accordance with a fourth embodiment of the disclosure.

Please refer to FIG. 6, which is a circuit diagram of a hardware-in-the-loop simulation device in accordance with a fourth embodiment of the disclosure. FIG. 6 illustrates another circuit structure of the HIL simulation device. As shown in FIG. 6, the HIL simulation device 4 includes a MCU 41 and a PWM signal observation circuit 42, and the HIL simulation device 4 is coupled to a driver D'.

The MCU 41 is coupled to the PWM signal observation circuit 42 and receives a PWM signal Ps from the driver D'. The PWM signal observation circuit 42 includes a voltage source 422, a capacitor 421, a transistor 423 and a gate driver 424. The difference between this embodiment and the third embodiment is that the power source unit of the PWM signal observation circuit 42 is the voltage source 422 having a power source B and a resistor R. The gate of the transistor 423 is coupled to the gate driver 424 and receives the PWM signal Ps from the driver D' via the gate driver 424. The drain of the transistor 423 is coupled to the voltage source 422 and one end of the capacitor 421. The source of the transistor 423 and the other end of the capacitor 421 are grounded. The MCU 41 is coupled to the drain of the transistor 423, the voltage source 422 and one end of the capacitor 421.

Similarly, when the MCU 41 detects the falling edge of the PWM signal Ps, the MCU 41 detects the voltage Vs of the capacitor 421. Then, the MCU 41 calculates the duty cycle of the PWM signal Ps according to the voltage Vs and the charge-discharge model of the capacitor 421.

The embodiment just exemplifies the disclosure and is not intended to limit the scope of the disclosure. Any equivalent modification and variation according to the spirit of the disclosure is to be also included within the scope of the following claims and their equivalents.

To sum up, according to one embodiment of the disclosure, the HIL simulation device can directly calculate the duty cycle of a PWM signal via an energy storage unit without using FPGA chip, so the cost of the HIL simulation device can be significantly reduced.

Besides, according to one embodiment of the disclosure, the resolution of the HIL simulation device is determined by the digital-to-analog converter of the processing circuit of the HIL simulation device. Therefore, the resolution of the HIL simulation device can be increased by replacing the digital-to-analog converter, which is more flexible in use.

Moreover, according to one embodiment of the disclosure, the HIL simulation device can increase the input resolution of the PWM signal, so the HIL simulation device can obtain the PWM signal with high resolution and effectively reduce the burden of the processing circuit of the HIL simulation device.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A pulse-width modulation signal observation circuit, comprising:
   a power source unit;
   an energy storage unit, directly connected to the power source unit and a processing circuit;
   a switch unit, connected to the energy storage unit and the power source unit, and configured to control the power source unit to charge the energy storage unit, wherein the switch unit and the energy storage unit are connected in parallel;
   wherein a signal source transmits a pulse-width modulation signal to the switch unit and the processing circuit, wherein the switch unit is in a first status when the pulse-width modulation signal is at high level, such that the power source unit charges the energy storage unit, and the processing circuit detects a voltage of the energy storage unit in order to calculate a duty cycle of the pulse-width modulation signal when the processing circuit detects a falling edge of the pulse-width modulation signal.

2. The pulse-width modulation signal observation circuit of claim 1, wherein the processing circuit calculates the duty cycle of the pulse-width modulation signal according to the voltage of the energy storage unit and a charge-discharge model of the energy storage unit.

3. The pulse-width modulation signal observation circuit of claim 1, wherein the first status is an off status.

4. The pulse-width modulation signal observation circuit of claim 1, wherein when the switch unit is in a second status when the pulse-width modulation signal is at low level, such that the energy storage unit is discharged.

5. The pulse-width modulation signal observation circuit of claim 4, wherein the second status is an on status.

6. The pulse-width modulation signal observation circuit of claim 1, wherein the power source unit is connected to the processing circuit.

7. The pulse-width modulation signal observation circuit of claim 1, wherein the power source unit is a current source or a voltage source.

8. The pulse-width modulation signal observation circuit of claim 1, wherein the switch unit is a metal-oxide-semiconductor field-effect transistor or an insulated gate bipolar transistor.

9. The pulse-width modulation signal observation circuit of claim 1, wherein the energy storage unit is a capacitor.

10. A hardware-in-the-loop simulation device, comprising:
    a processing circuit;
    a pulse-width modulation signal observation circuit, comprising:
       an energy storage unit directly connected to a power source unit and the processing circuit; and
       a switch unit connected to the energy storage unit and the power source unit;
       wherein the switch unit and the energy storage unit are connected in parallel;
    wherein a signal source transmits a pulse-width modulation signal to the processing circuit and the pulse-width modulation signal observation circuit;
    wherein the energy storage unit is charged when the pulse-width modulation signal is at high level, and the processing circuit detects a voltage of the energy storage unit in order to calculate a duty cycle of the pulse-width modulation signal when the processing circuit detects a falling edge of the pulse-width modulation signal.

11. The hardware-in-the-loop simulation device of claim 10, wherein the processing circuit calculates the duty cycle of the pulse-width modulation signal according to the voltage of the energy storage unit and a charge-discharge model of the energy storage unit.

12. The hardware-in-the-loop simulation device of claim 10, wherein the switch unit is in a first status when the pulse-width modulation signal is at high level, such that the power source unit charges the energy storage unit.

13. The hardware-in-the-loop simulation device of claim 12, wherein the first status is an off status.

14. The hardware-in-the-loop simulation device of claim 12, wherein when the switch unit is in a second status when the pulse-width modulation signal is at low level, such that the energy storage unit is discharged.

15. The hardware-in-the-loop simulation device of claim 14, wherein the second status is an on status.

16. The hardware-in-the-loop simulation device of claim 12, wherein the power source unit is connected to the processing circuit.

17. The hardware-in-the-loop simulation device of claim 12, wherein the power source unit is a current source or a voltage source.

18. The hardware-in-the-loop simulation device of claim 12, wherein the switch unit is a metal-oxide-semiconductor field-effect transistor or an insulated gate bipolar transistor.

19. The hardware-in-the-loop simulation device of claim 10, wherein the energy storage unit is a capacitor.

20. The hardware-in-the-loop simulation device of claim 10, wherein the processing circuit comprises a digital-to-analog converter, and the processing circuit receives the voltage of the energy storage unit via the digital-to- analog converter.

* * * * *